United States Patent [19]

Tokunoh

[11] Patent Number: 5,281,847
[45] Date of Patent: Jan. 25, 1994

[54] GROOVE STRUCTURE FOR ISOLATING ELEMENTS COMPRISING A GTO STRUCTURE

[75] Inventor: Futoshi Tokunoh, Fukuoka, Japan

[73] Assignee: Mitsubishi Denki Kabushik Kaisha, Tokyo, Japan

[21] Appl. No.: 8,833

[22] Filed: Jan. 25, 1993

Related U.S. Application Data

[63] Continuation of Ser. No. 707,904, May 30, 1991, abandoned.

[30] Foreign Application Priority Data

Jun. 12, 1990 [JP] Japan .................. 2-154621

[51] Int. Cl.⁵ .............. H01L 29/06; H01L 29/74; H01L 31/111
[52] U.S. Cl. ............... 257/618; 257/149; 257/622; 257/623; 257/626
[58] Field of Search ......... 357/38, 39, 49, 55, 357/51, 56, 50, 47; 257/149, 618, 622, 623, 626

[56] References Cited

U.S. PATENT DOCUMENTS

| | | | |
|---|---|---|---|
| 4,047,219 | 9/1977 | Temple | 257/622 |
| 4,742,382 | 5/1988 | Jaccklin | 357/55 |
| 4,808,550 | 2/1989 | Fukushima | 357/55 |

FOREIGN PATENT DOCUMENTS

| | | |
|---|---|---|
| 0164645 | 12/1985 | European Pat. Off. |
| 0200863 | 12/1986 | European Pat. Off. |
| 286855 | 10/1988 | European Pat. Off. |
| 2851375 | 6/1979 | Fed. Rep. of Germany ........ 357/55 |
| 3521079 | 12/1985 | Fed. Rep. of Germany . |
| 0194564 | 10/1985 | Japan ................... 357/55 |

OTHER PUBLICATIONS

Vol. 6, No. 251 (E-147)(1129) Dec. 10, 1982, Patent Abstracts of Japan JP 57148371, Sep. 13, 1982.
International Electron Devices Meeting 1981—Technical Digest, Dec. 1981, pp. 410–413, Washington, DC, John X, Przybysz and Earl S. Schlegel "Thrystors with Overvoltage Self-Protection", p. 411.
EPE '89 3rd European Conference On Power Electronics and Applications, Oct. 1989, Aachen, Germany, pp. 121–125, M. Ishidoh et al., "A New Reverse Conducting GTO".
IBM Technical Disclosure Bulletin, vol. 31, No. 7, Dec. 1988, New York, pp. 420–422, "Accelerated Etching of Silicon in Anisotropic Ethylene Diamine-Water-Pyrazine-Pyrocatheol Bath".

Primary Examiner—Rolf Hille
Assistant Examiner—Wael Fahmy
Attorney, Agent, or Firm—Oblon, Spivak, McClelland, Maier & Neustadt

[57] ABSTRACT

A semiconductor structure comprises a gate-turn-off thyristor region (GR) and a diode region (DR) with an isolation area (SR) therebetween. The isolation area is provided with a multistage groove (30) having step structures (34,35). The multistage groove is formed through a two-stage etching process, and over-etched regions in the bottom corners of the multistage groove are relatively shallow ones. This structure is effective for increasing the breakdown voltage of the semiconductor structure and isolations between a the gate-turn-off thyristor region and the diode region.

9 Claims, 11 Drawing Sheets

GROOVE STRUCTURE FOR ISOLATING ELEMENTS COMPRISING A GTO STRUCTURE

This application is a continuation of application Ser. No. 07/707,904, filed on May 30, 1991, now abandoned.

BACKGROUND OF THE INVENTION

1. Field of the Invention

The present invention relates to a semiconductor device and a manufacturing method thereof and more particularly to an improvement on a groove structure used for resistive isolation between elements.

2. Description of the Prior Art

FIG. 9 is a partial cross-sectional view showing the structure of a conventional reverse-conducting gate turn-off thyristor (reverse-conducting GTO) 100 in the vicinity of an element isolation region. FIG. 9 corresponds to a cross section of a part 100a of the reverse-conducting GTO 100 taken along the line IX—IX of FIG. 10 which is a plan view thereof.

The reverse-conducting GTO 100 comprises a semiconductor body 110, which has a pnpn four-layer structure consisting of an n emitter layer 111 ($n_E$), a p base layer 112 ($p_B$) an n base layer 113 ($n_B$) and p emitter layers 115 ($p_E$). Although FIG. 9 shows a single n emitter layer 111, a large number of n emitter layers 111 are formed on the p base layer 112. Between the respective p emitter layers 115 is provided an n-type high impurity concentration region 116 (n+).

The semiconductor body 110 incorporates a GTO and a diode in reverse parallel. A region GR is a GTO region, which is connected to an external circuit through a cathode layer 122 (K) gate electrode layers 123 (G) and an anode layer 124 (A). A region DR is a diode region, in which an electrode layer 121 is used as an anode of the diode and the electrode layer 124 functions also as a cathode of the diode. The electrode layer 121 is electrically connected to the cathode layer 122.

An element isolation region SR is provided between the GTO region GR and the diode region DR. In the element isolation region SR is formed an element isolation structure 130 having an isolating groove 131. The isolating groove 131 is formed by selectively etching the p base layer 112. Overetched portions 134 and 135 are formed at the foot of sidewalls 132 and 133 of the isolating groove 131. A p+ isolation layer 114 is formed selectively in the part of the n base layer 113 under the isolating groove 131.

A p region 112c which is the part of the p base layer 112 at the bottom of the isolating groove 131 has a function of resistively separating the p layer 112 into a part 112a in the GTO region GR and a part 112b in the diode region DR by sheet resistivity thereof. That is, since isolation resistance by the sheet resistivity of the p region 112c is inserted equivalently between the electrode layers 121 and 123, a leakage current between the gate and the cathode through the p region 112c can be reduced.

FIG. 11 is an enlarged view of the isolating groove 131. Under the same diffusion conditions and the like, the sheet resistivity of the p region 112c generally depends on the thickness of the p region 112c. The center of the bottom 136 of the isolating groove 131 is different from the overetched portions 134 and 135 in thickness of the p region 112c. The width $W_a$ of the respective overetched portions 134 and 135 is quite smaller than the overall width W of the isolating groove 131. Therefore the isolation resistance of the reverse-conducting GTO 100 by the region 112c is substantially determined by the thickness $D_a$ of the p region 112c in the center of the bottom 136 of the isolating groove 131. The smaller the thickness $D_a$ is, the higher isolation capability is.

When a forward voltage is applied to the GTO region GR, a depletion layer extends in the p layer 112. FIG. 12 shows typically the extension of the depletion layer in the vicinity of the overetched portion 134 enclosed by the broken line in FIG. 9. As the forward applied voltage increases, the extension quantity of the depletion layer 140 increases, so that the top 141 thereof approaches the overetched portion 134 to be exposed to the isolating groove 131. The influence of ions and the like adhering on the overetched portion 134 causes local electric field concentration on the top of the depletion layer 140, sometimes resulting in breakdown of the reverse-conducting GTO 100. For improving a forward breakdown voltage of the reverse-conducting GTO 100, the thickness $D_b$ (in FIG. 11) of the p region 112c at the deepest part of the overetched portions 134 and 135 should be large.

In the conventional reverse-conducting GTO 100, however, increase in the thickness $D_b$ inevitably results in increase in the thickness $D_a$ of the center because of a $D_b < D_a$ relation. There is a trade-off relation between the isolation resistance and the forward breakdown voltage, and it is difficult to improve both of them at the same time. FIG. 13 is a graph illustrating such a state, in which the forward breakdown voltage starts to drop when the isolation resistance exceeds about 7012. The broken line in FIG. 13 represents a theoretical value of the breakdown voltage of $p_B n_B$ junction.

SUMMARY OF THE INVENTION

According to the present invention, a semiconductor device comprises: (a) a first semiconductor element structure formed in a first region of a semiconductor body; (b) a second semiconductor element structure formed at a distance from the first semiconductor element structure in the direction parallel to a major surface of the semiconductor body; and (c) an element isolation structure provided between the first and second semiconductor element structures, wherein the element isolation structure is provided with a multistage groove formed on the major surface and having a depth increasing stepwise in series toward the center thereof.

Preferably, the width of a step structure in an inner wall portion of the multistage groove is 10% or more of the overall width of the multistage groove.

The present invention is also directed to a method of manufacturing a semiconductor device. According to the present invention, the method comprises the steps of: (a) forming on a semiconductor body first and second semiconductor element structures disposed with a predetermined area on a major surface therebetween in the direction parallel to the major surface; (b) etching selectively a part of the major surface of the semiconductor body within the area to form a groove having a predetermined width within the area; and (c) etching selectively the major surface of the semiconductor body in the range including the groove and wider than the groove to form a multistage groove having a depth increasing stepwise in series toward the center thereof.

Preferably, in the method, the step (c) comprises the step of selectively etching the major surface of the semiconductor body so that a step structure having a width of 10% or more of the overall width of the multistage groove is formed in an inner wall portion of the multistage groove.

According to the semiconductor device of the present invention, resistive isolation between the elements is carried out by the use of the multistage groove having the depth increasing stepwise in series toward the center thereof. The depth of the multistage groove in the center can be increased without increasing the depth thereof at the very ends. The isolation resistance can therefore be improved while a breakdown voltage is not decreased. Particularly by setting the width of the step structure in the inner wall portion of the multistage groove to 10% or more of the overall width of the multistage groove, the depth of the groove in the center can be sufficiently increased independently of the influence of the local shape of the multistage groove in the vicinity of the very ends.

According to the method of the present invention, the aforesaid multistage groove is provided through the repetition of etching. The depth of the multistage groove in the center can be increased without being restricted by the overetched depth of the multistage groove at the very ends.

As described hereinabove, according to the present invention of claim 1, the resistive isolation between the elements is carried out by the use of the multistage groove, so that the depth of the groove in the center is determinable without the restriction by the depth thereof at the very ends. Therefore, a semiconductor device capable of increasing both isolation resistance and breakdown voltage can be achieved.

According to the present invention of claim 2, since the depth of the groove in the center can be increased independently of the influence of the local shape of the multistage groove in the vicinity of the very ends, the isolation resistance and the breakdown voltage can be further improved.

According to the present invention of claims 3 and 4, the aforesaid multistage groove is provided through the repetition of etching. The depth of the multistage groove in the center can be increased without being restricted by the overetched depth of the multistage groove at the very ends. Hence, a semiconductor device in which both the isolation resistance and the breakdown voltage are improved can be provided.

Therefore an object of the present invention is to provide a semiconductor device and a manufacturing method thereof capable of improving both isolation resistance and breakdown voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Device Structure

Figure 1:
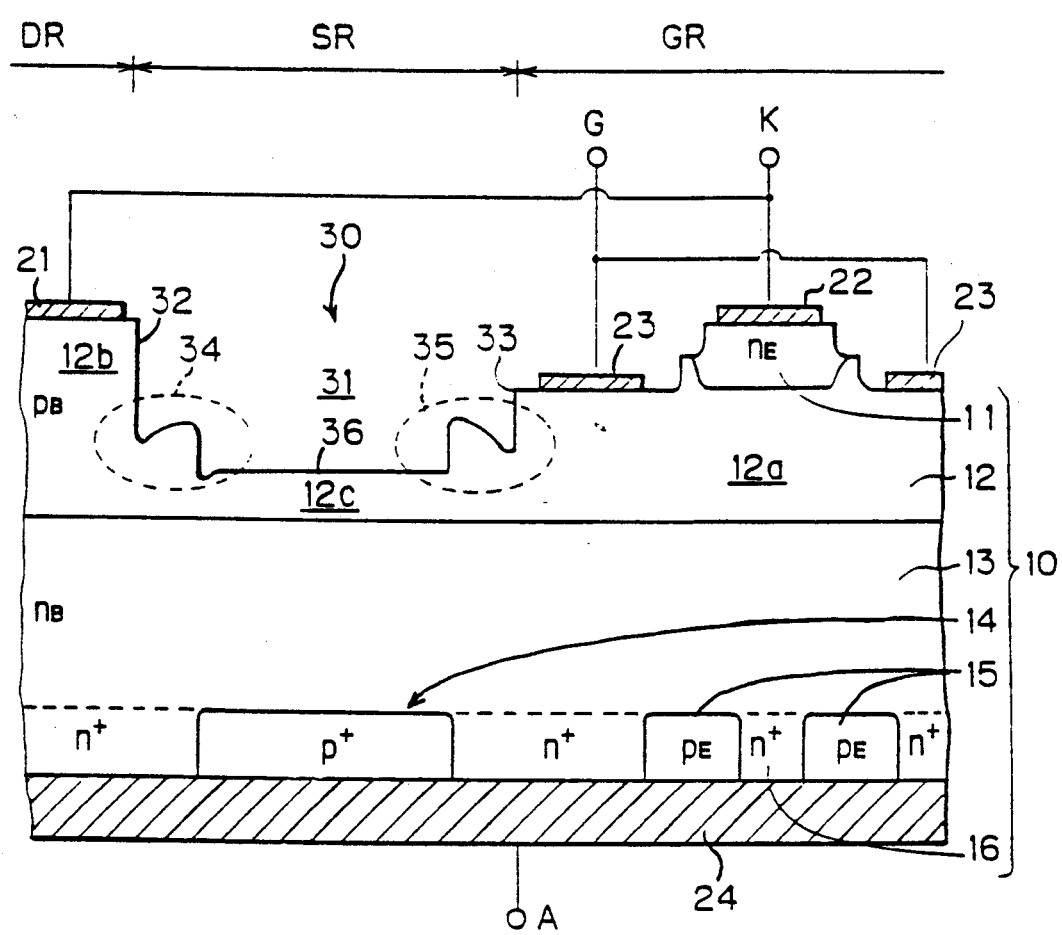
FIG. 1 is a partial cross-sectional view of a reverse-conducting GTO according to one preferred embodiment of the present invention.
Figure 2A:
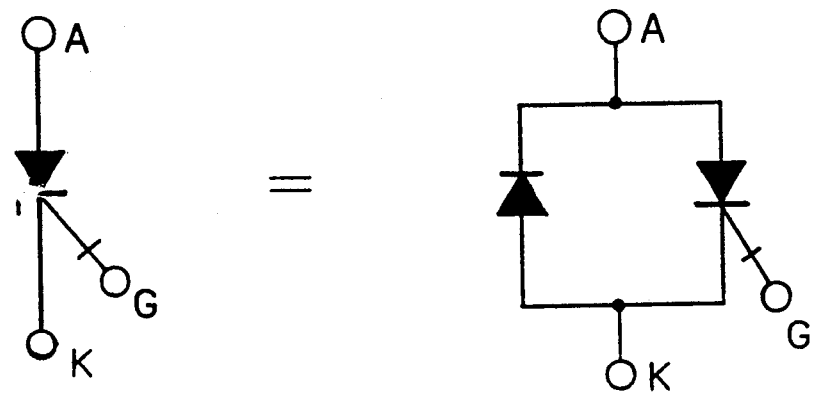
FIG. 2A is an equivalent circuit diagram of the reverse-conducting GTO.
Figure 2B:
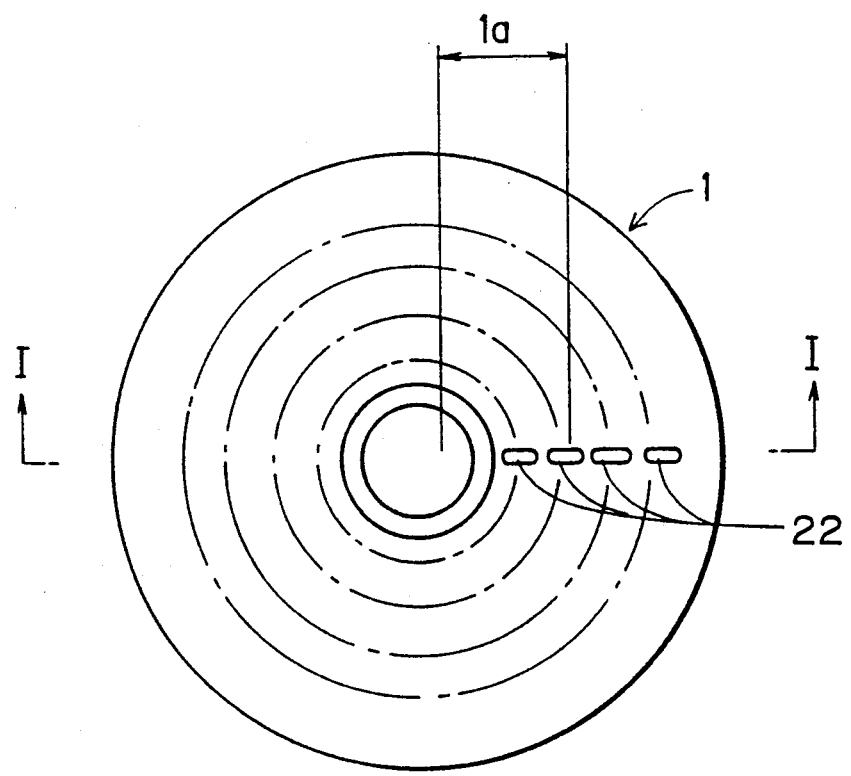
FIG. 2B is a plan view of the reverse-conducting GTO according to the preferred embodiment.

FIG. 1 is a partial cross-sectional view of a reverse-conducting GTO 1 according to one preferred embodiment of the present invention and corresponds to a cross section of a part 1a of the reverse-conducting GTO 1 taken along the line I—I of FIG. 2B which is a plan view thereof. The reverse-conducting GTO 1 corresponds to a reverse parallel connection between a GTO and a diode as shown in FIG. 2A.

As shown in FIG. 1, the reverse-conducting GTO 1 comprises a semiconductor body 10, in which a p base layer 12 ($p_B$) is formed on an n base layer 13 ($n_B$). An n emitter layer 11 is selectively provided on the p base layer 12. Although a single n emitter layer 11 is shown in FIG. 1, a large number of n emitter layers 11 are disposed on the semiconductor body 10. In lower portions of the n base layer 13 are selectively formed p emitter layers 15 ($p_E$). An n-type high impurity concentration region 16 ($n^+$) is provided between the respective p emitter layers 15.

The semiconductor body 10 is provided with three regions GR, DR and SR disposed in the direction parallel to a major surface thereof. The region GR constitutes a GTO and the region DR constitutes a diode. The region SR is an element isolation region used for the resistive isolation between the GTO region GR and the diode region DR, and is provided with an element isolation structure 30. The element isolation structure 30 has a multistage groove 31 formed in the p layer 12. The overall width of the multistage groove 31 is specified by sidewalls 32 and 33, and the depth thereof increases toward the center stepwise in series. Accordingly the width of the bottom 36 of the multistage groove 31 is smaller than the distance between the sidewalls 32 and 33, that is, the overall width of the multistage groove 31. The p layer 12 is divided into p regions 12a, 12b and 12c in accordance with the division by the regions GR, DR and SR. In a lower portion of the n base layer 13 is formed a p-type high impurity concentration region 14 ($p^+$) having a width corresponding to the bottom 36.

On the major bottom surface of the semiconductor body 10 is brazed an anode layer 24 composed of molybdenum. Cathode layers 22 are provided on the n emitter layers 11. Corresponding to the numerous n emitter layers 11, the cathode layers 22 are also arranged concentrically in great numbers (as shown in FIG. 2B) An anode layer 21 of the diode is formed on the p region 12b and is connected to the cathode layer 22 in common. Gate electrodes 23 are formed on the p region 12a. These electrode layers 21, 22 and 23 are composed of aluminium, for example.

The operational characteristics of the reverse-conducting GTO 1 depend on the shape of the multistage groove 31, however, the details of the shape can be understood through the forming processes of the multistage groove 31. Hereinafter described are the manufacturing processes of the reverse-conducting GTO 1 and subsequently the operational characteristics thereof.

B. Manufacturing Processes

Figure 3A:
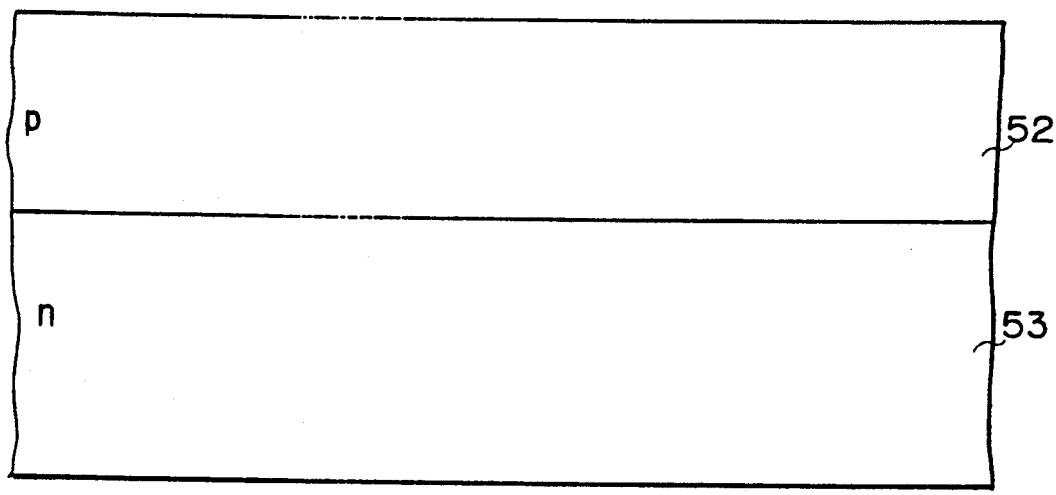
FIGS. 3A-3F are cross-sectional views showing manufacturing processes of the reverse-conducting GTO according to the preferred embodiment.

First prepared is a structure in which a p diffusion layer 52 is provided on the major top surface of an n-type semiconductor substrate 53 as shown in FIG. 3A. This structure is prepared, for example, in such a manner that p-type impurities are diffused on the both major surfaces of an n-type silicon wafer and a p diffusion layer on the major bottom surface side is removed by lap-off process.

Figure 3B:
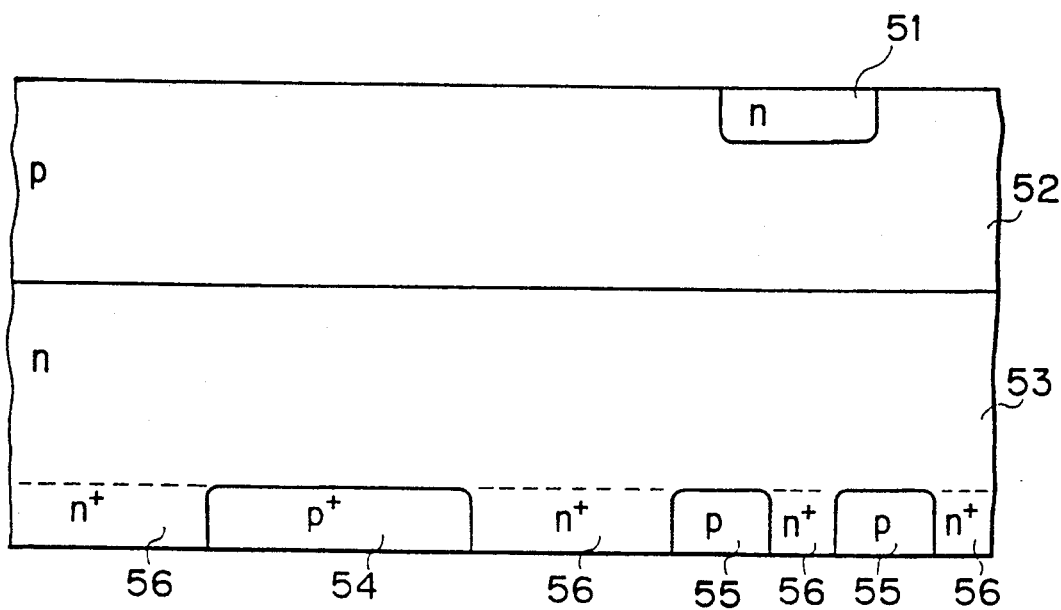

Next, n-type impurities are selectively diffused on the major top surface of the p diffusion layer 52 to provide an n diffusion layer 51, as shown in FIG. 3B. After n-type impurities are diffused at high concentration on the major bottom surface of the n layer 53, p-type impurities are selectively diffused thereon to provide a p$^+$ layer 54, p layers 55 and n$^+$ layers 56. The n layer 51 may be formed after the layers 54–56 are formed.

Figure 3C:
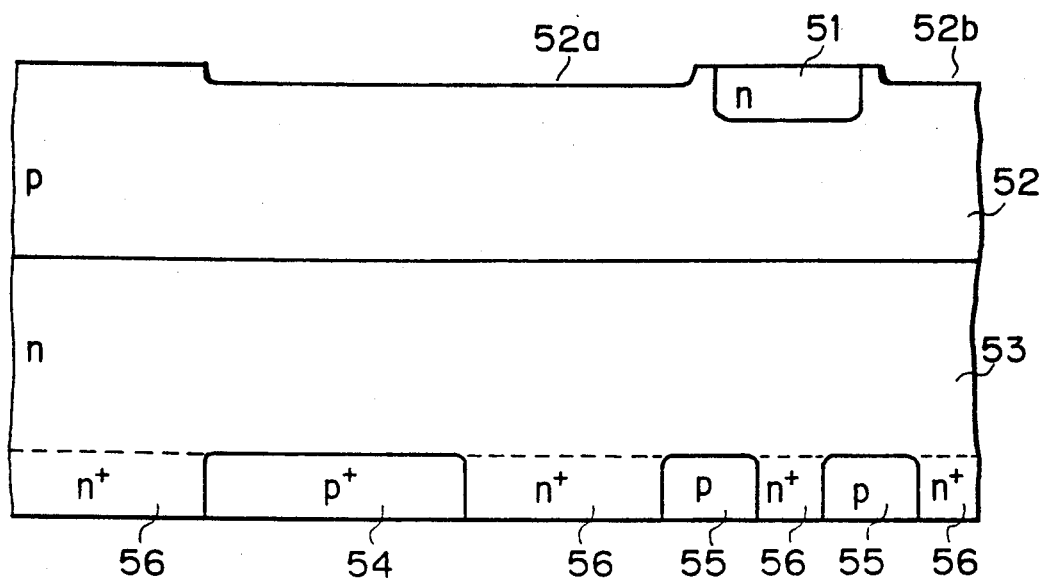

In the next step (in FIG. 3C), the top surface of the p diffusion layer 52 is selectively etched to form shallow concaves 52a and 52b. The area including the concaves 52a and 52b and the sides of the n diffusion layer 51 is further selectively etched, thereby the n diffusion layer 51 being formed into a mesa shape (in FIG. 3D).

Figure 3D:
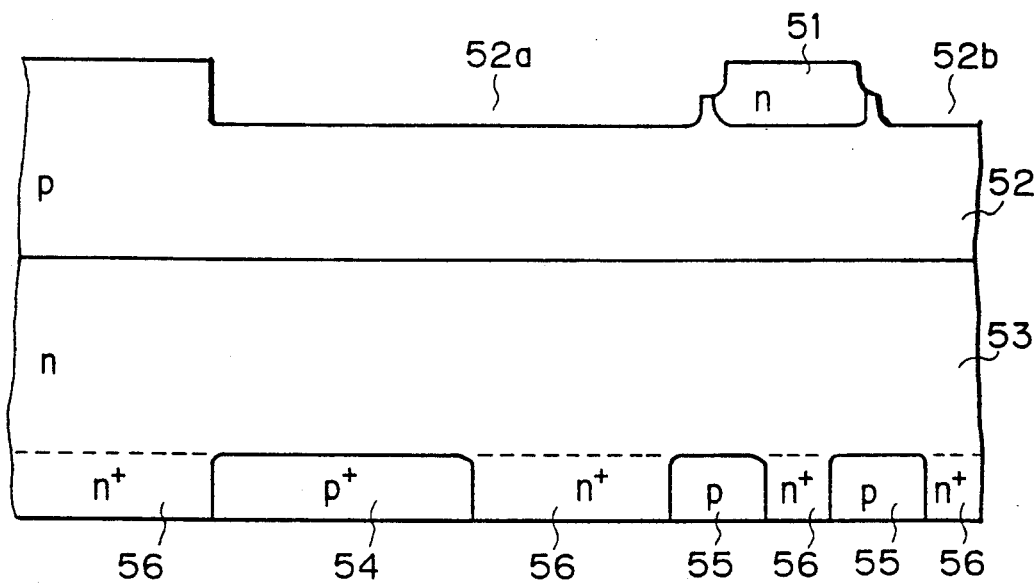

In the next step (in FIG. 3E), a silicon oxide film 61 is formed on the entire top surface of the structure of FIG. 3D and is patterned by means of photolithography. The patterned oxide film 61 has a window 62 in the center of an area AR to be formed into the element isolation region SR. The window 62 is narrower than the area AR. Masked with the oxide film 61, the p layer 52 is selectively etched to form a relatively shallow groove 41. The depth of the groove 41 is preferably about 15% or more of the depth of the multistage groove to be formed (whose numerical value example is described later). This etching is carried out by the use of a mixture of hydrofluoric acid and nitric acid or an etchant prepared by adding acetic acid to the mixture. This wet etching is referred to as "first etching" hereinafter. The first etching forms overetched portions 42 at both ends of the groove 41. Since the groove 41 is shallow, the overetched quantity is a little.

Figure 3E:
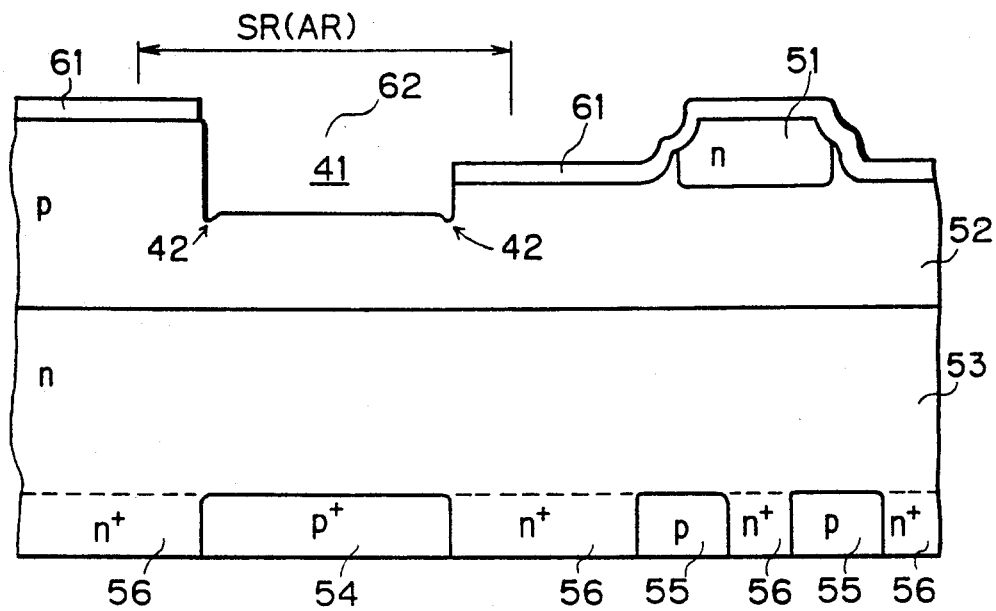
Figure 3F:
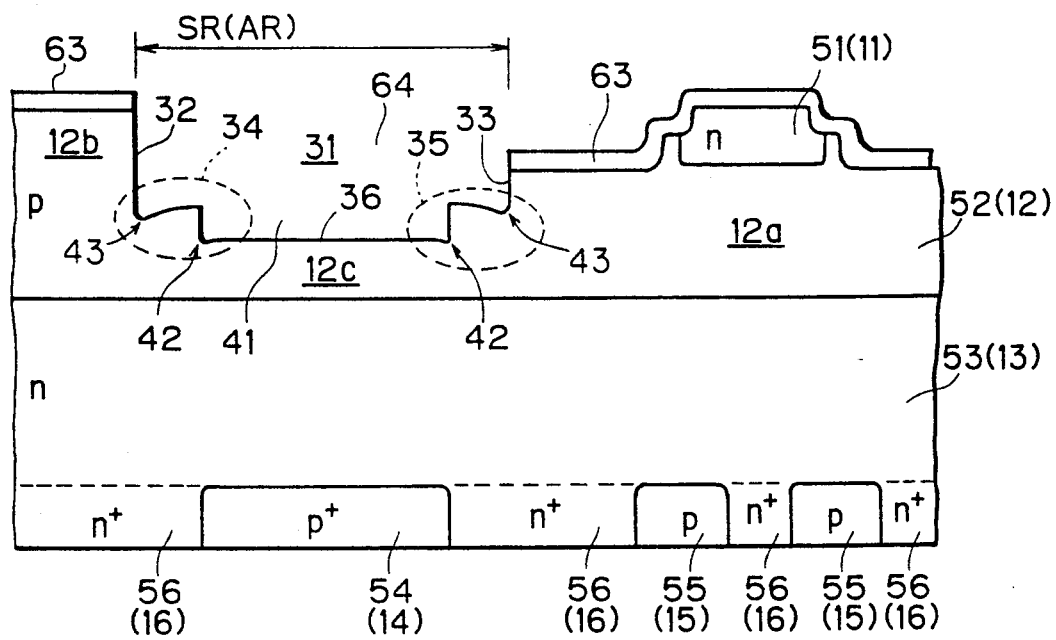

After the removal of the oxide film 61, a new silicon oxide film 63 (in FIG. 3F) is formed on the entire top surface. The oxide film 63 is selectively removed by means of photolithography, thereby the oxide film 63 being patterned. The patterned oxide film 63 has a window 64 having the width substantially equal to that of the area AR. In the case where the oxide film 61 of FIG. 3E is formed relatively thick, the oxide film 63 may be obtained by removing the oxide film 61 selectively.

Next, masked with the oxide film 63, the top surface of the p layer 52 is selectively etched (second etching) by the use of the same etchant as described above. By the second etching, the depth of the groove 41 is increased on the whole, and part of the p layer 52 positioned outside the groove 41 is also removed. As a result, the multistage groove 31 having step structures 34 and 35 at both ends is obtained. Overetched portions 42 and 43 are found at the respective concave corners of the step structures 34 and 35. The overetched portions 43 are formed during the second etching. Subsequently, the oxide film 63 is removed, and the electrode layers 21–24 of FIG. 1 are formed so that the reverse-conducting GTO 1 is provided. The layers 51–56 of FIG. 3F correspond to the layers 11–16 of FIG. 1, respectively.

C. Detailed Shape and Operational Characteristic

Figure 4A:
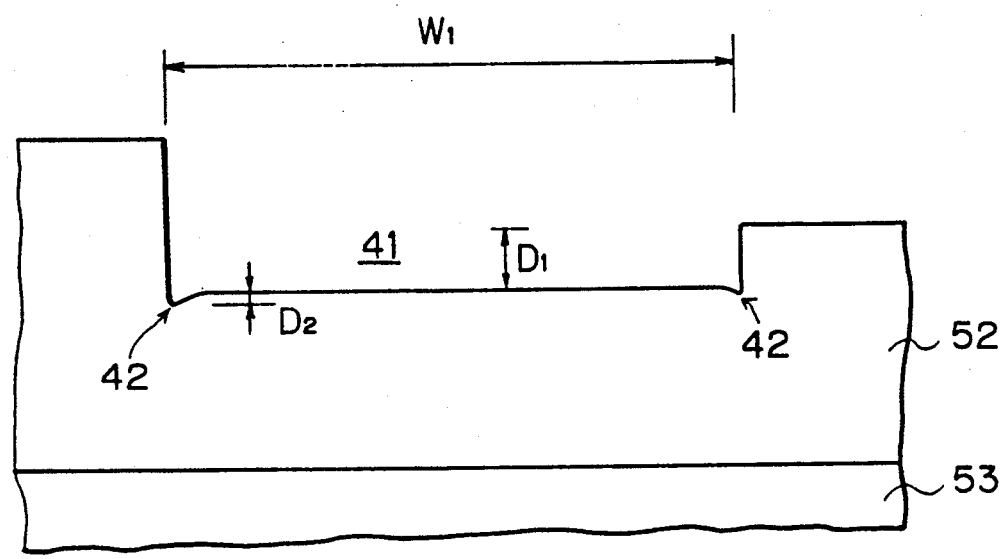
FIGS. 4A and 4B are enlarged views of a multistage groove structure in manufacturing steps according to the preferred embodiment, respectively.

The detailed shape of the multistage groove 31 obtained by these manufacturing processes is described hereinafter. First in FIG. 4A showing the state when the first groove 41 is formed, the width $W_1$ of the groove 41 is, for example, 2.0 nm. The depth $D_1$ of the groove 41 in the center is about 10 μm. When a relation between the depth of the groove 41 and an overetched quantity $D_2$ is examined in the formation of the groove 41, $$D_2 = k \cdot D_1 \qquad (1)$$

can be found, where it has been confirmed that the proportional constant k ranges from 0.1 to 0.15. Therefore, the overetched quantity $D_2$ is about 1.0–1.5 μm.

Figure 4B:
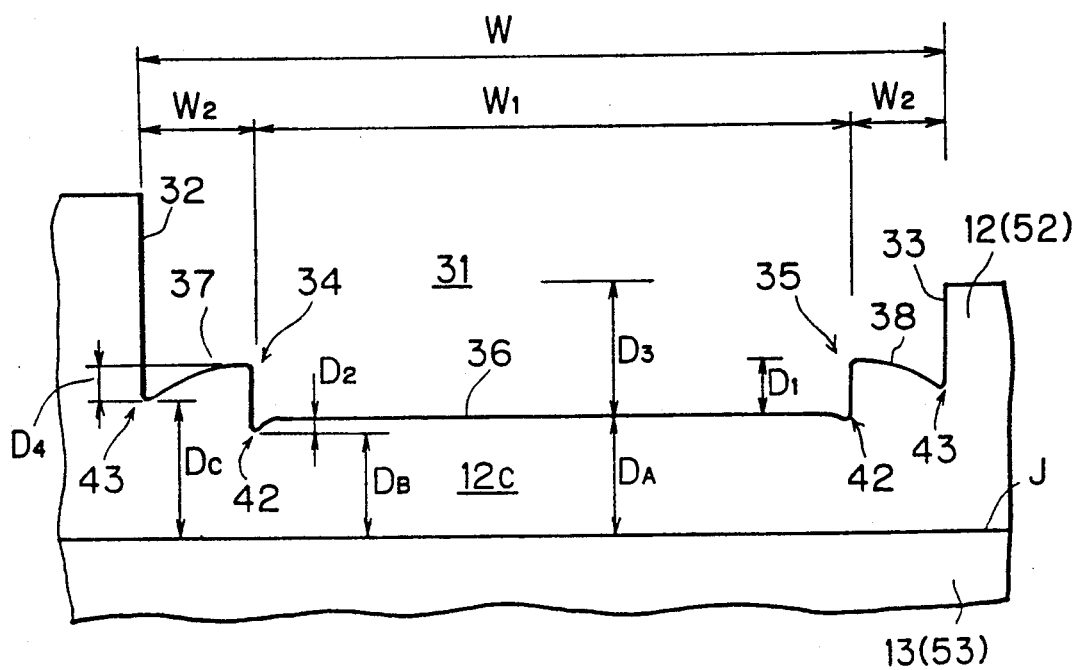

In FIG. 4B showing the state when the formation of the multistage groove 31 is finished, the overall width W of the multistage groove 31 is, for example, 3.0 mm. The width of the step structures 34 and 35, that is, the width $W_2$ of each step surface 37 and 38 is as follows:

$$\begin{aligned} W_2 &= (W - W_1)/2 \\ &= 0.5 \text{ mm} \end{aligned} \qquad (2)$$

In the case of carrying out the etching so that the depth $D_3$ of the multistage groove 31 is adapted to be 60 μm, an overetched quantity $D_4$ at the overetched portions 43 is, for example, 6–9 μm. With respect to a distance from the interface J of the p layer 12 and the n layer 13 to the bottom 36 of the multistage groove 31 in the center, that is, the thickness $D_A$ of the p region 12c in the center, distances $D_B$ and $D_C$ from the overetched portions 42 and 43 respectively to the interface J are in the following relations:

$$\begin{aligned} D_B &= D_A - D_2 \\ &= D_A - 1.0 \text{ μm} \end{aligned} \qquad (3)$$

$$\begin{aligned} D_C &= D_A + D_1 - D_4 \\ &= D_A + 10 \text{ μm} - 6 \text{ μm} \\ &= D_A + 4 \text{ μm} \end{aligned} \qquad (4)$$

where 10 μm, 1.0 μm and 6 μm are used as example values of $D_1$, $D_2$ and $D_4$, respectively.

Figure 11:
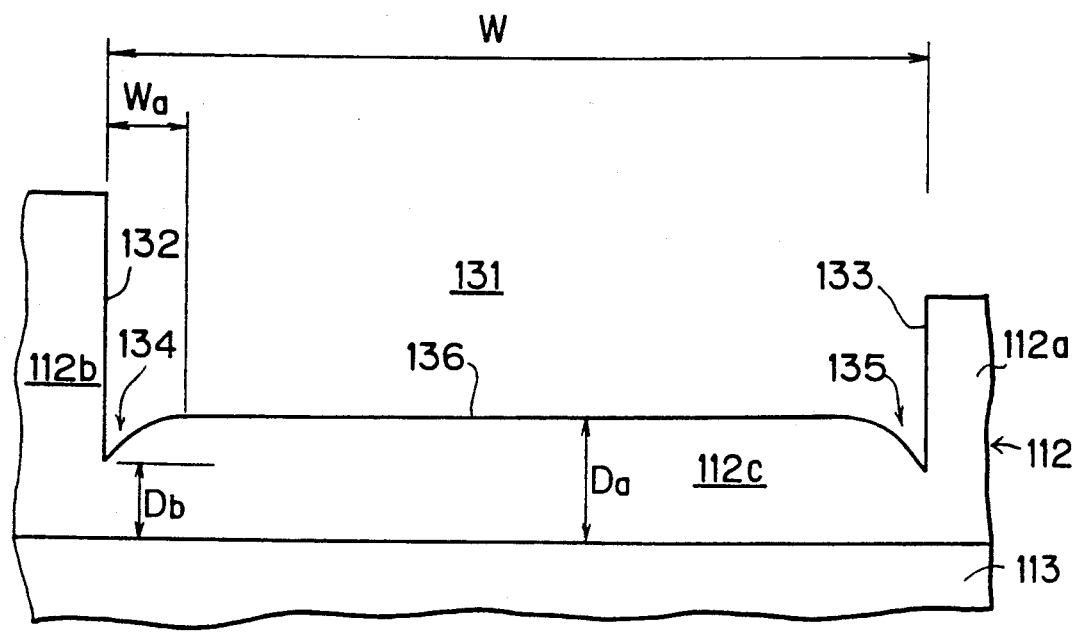
FIG. 11 is an enlarged view of a conventional resistive isolating groove.
Figure 12:
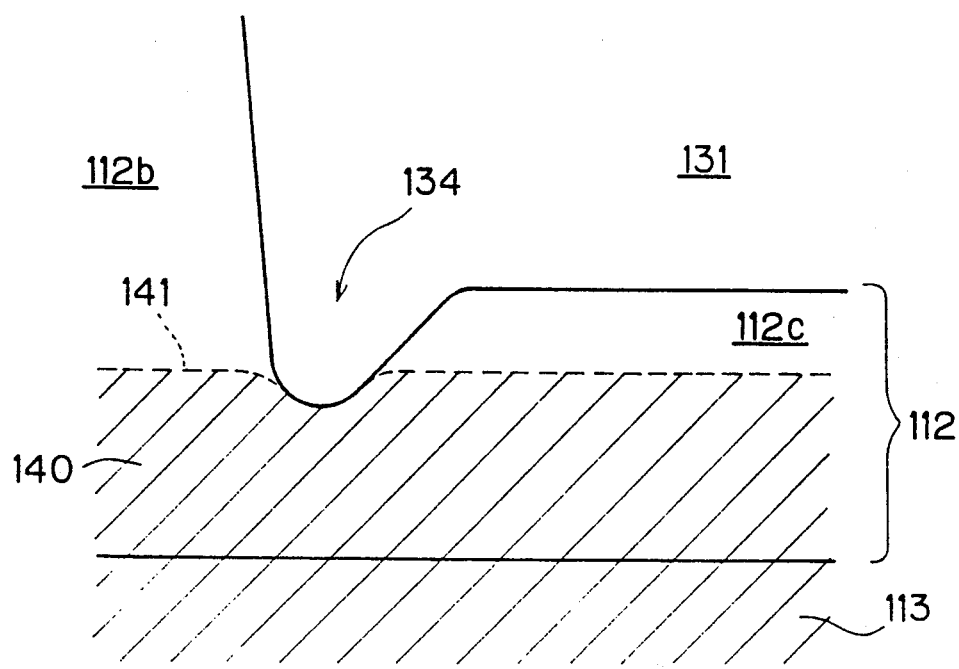
FIG. 12 is a characteristic explanatory view of the conventional reverse-conducting GTO.

What is found from the relations of the formulas (3) and (4) is described hereinafter. According to the formula (3), the bottom of the overetched portions 42 is deeper than that of the multistage groove 41 in the center, and the difference therebetween is about 1.0 μm. The relation between the thicknesses $D_a$ and $D_b$ of the prior art (in FIG. 11) is, for example, as follows:

$$D_b = D_a - 6.0 \mu m \quad (5)$$

From the comparison, it is found that the bottom 36 of the multistage groove 31 is substantially flat through the whole area and the overetched portions 42 are not so close to the interface J in the reverse-conducting GTO 1 according to the preferred embodiment. This is because the shape of the overetched portions 42 does not change substantially in the second etching so that the overetched quantity $D_2$ in the first etching is maintained.

The overetched portions 43 immediately under the sidewalls 32 and 33 of the multistage groove 31 are, as is obvious from the formula (4), considerably above the bottom 36. The influence of the overetched portions 43 on the electrical characteristics of the p region 12c can be practically disregarded.

Figure 5:
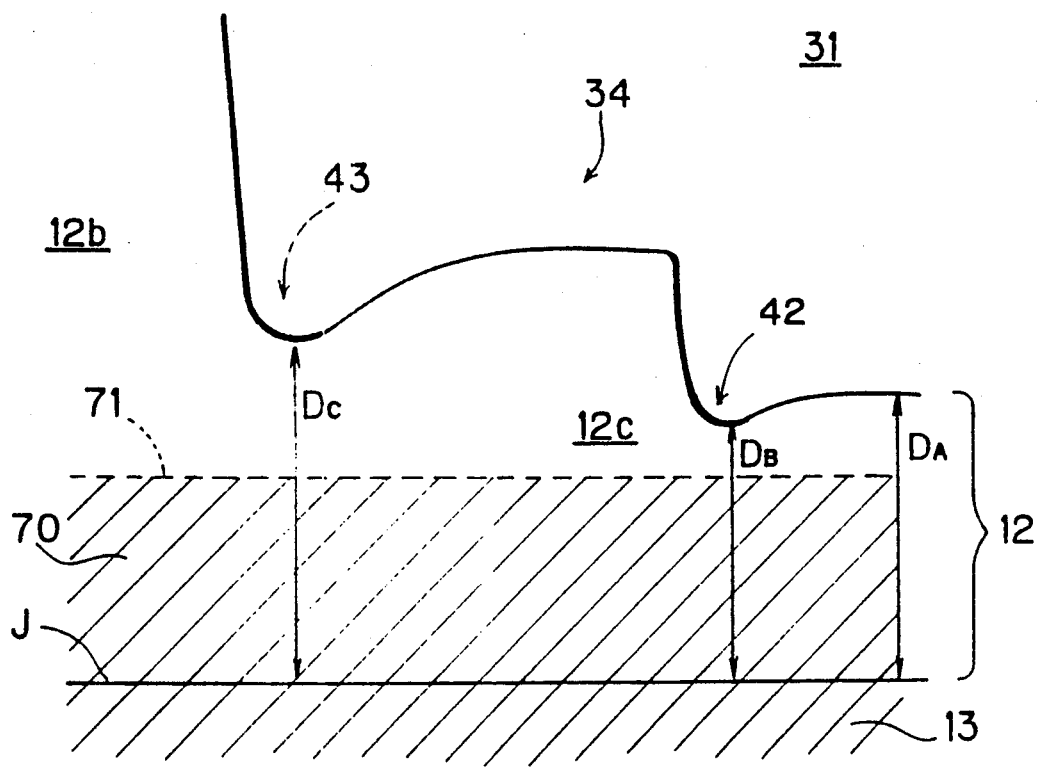
FIG. 5 is a characteristic explanatory view of a multistage groove according to the preferred embodiment.

FIG. 5 is a typical enlarged view of the step structure 34. When a forward voltage is applied to the reverse-conducting GTO 1, a depletion layer 70 extends from the interface J of the p layer 12 and the n layer 13. The top 71 of the depletion layer 70 does not approach the overetched portions 42 easily. Even if the isolation resistance between the GTO and the diode is increased by decreasing the thickness $D_4$, the top 71 of the depletion layer 70 is not exposed to the surface of the p layer 12 easily. As a result, both the isolation resistance and the forward breakdown voltage can be improved. In other words, the forward breakdown voltage is remarkably improved when the value of the isolation resistance is the same as that of the prior art, and the value of the isolation resistance is remarkably improved when the forward breakdown voltage is the same as that of the prior art.

Figure 6:
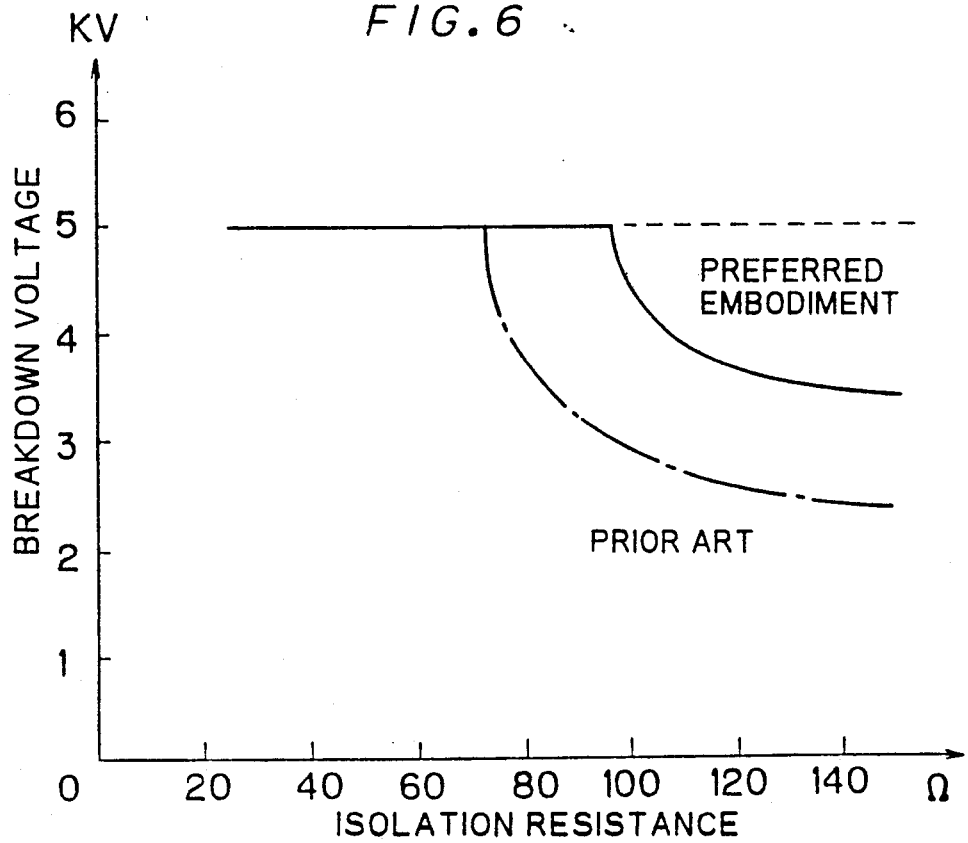
FIG. 6 is a graph illustrating a relation between isolation resistance and forward breakdown voltage in the reverse-conducting GTO according to the preferred embodiment.

FIG. 6 is a graph illustrating such a relation. In the reverse-conducting GTO 1 of the preferred embodiment, the forward breakdown voltage does not drop even if the isolation resistance is improved up to approximately 100Ω. A higher breakdown voltage than the prior art can be ensured in the region in which the forward breakdown voltage starts to drop.

When the width $W_2$ (in FIG. 4B) of the respective step structures 34 and 35 is too small, the overetched portions 42 and 43 overlap each other partially, and resultingly the overetched portions 42 grow too deep. Hence the width $W_2$ is preferably not too small. In the case where a silicon wafer of 100 mm in diameter is used for forming the reverse-conducting GTO 1 to be etched masked with a silicon oxide film, it has been confirmed that the lateral width of the overetched portions 43 is 50-10% of the overall width W of the area to be etched. Accordingly the width $W_2$ of the step structures 34 and 35 is preferably 10% or more of the width of the area AR, that is, the overall width W of the multistage groove 41. It can be easily confirmed that the width $W_2 = 0.5$ mm in this preferred embodiment is larger than 10% of the area width W = 3 mm.

D. Other Preferred Embodiments

Figure 7:
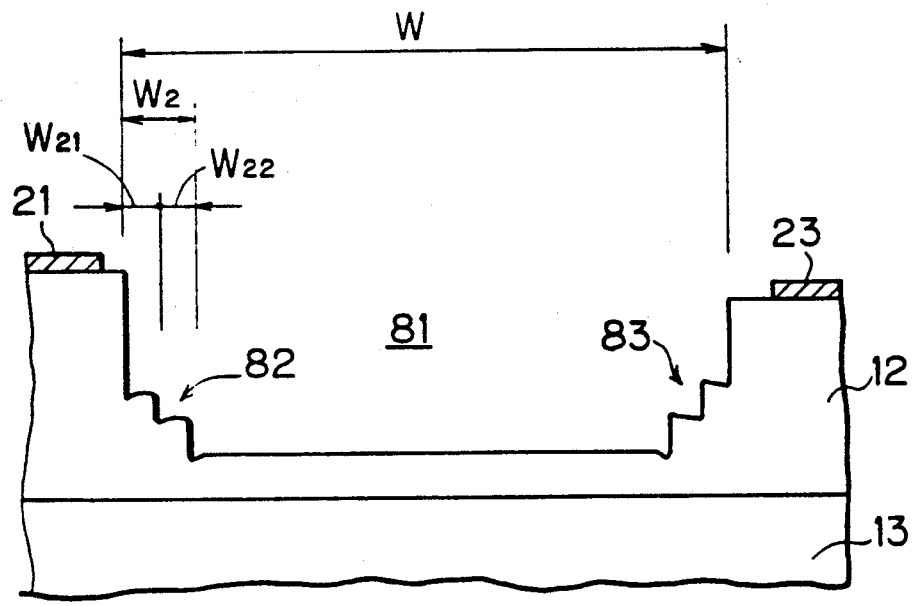
FIGS. 7, 8A and 8B are partial views of the multistage groove structure according to another preferred embodiment of the present invention.
Figure 8A:
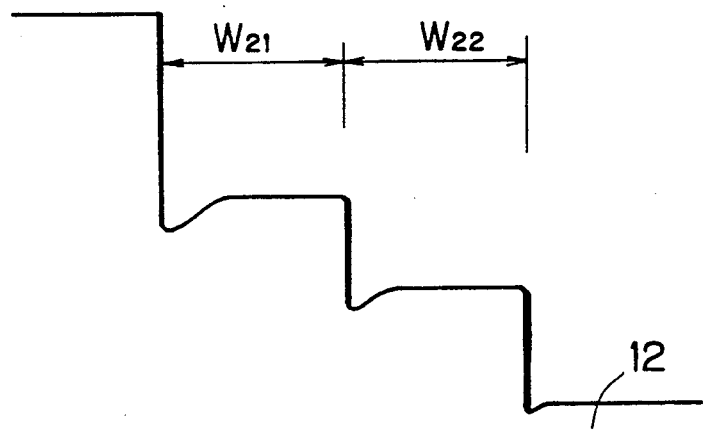
Figure 8B:
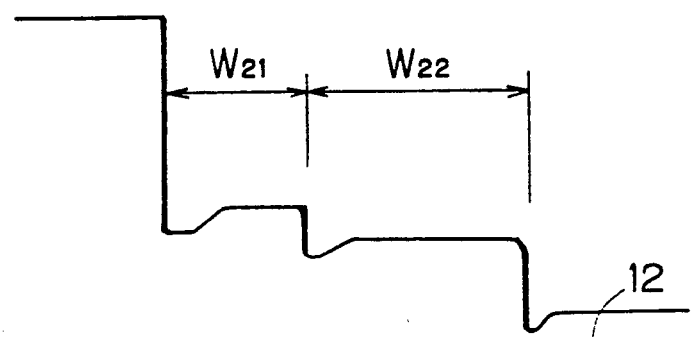
Figure 9:
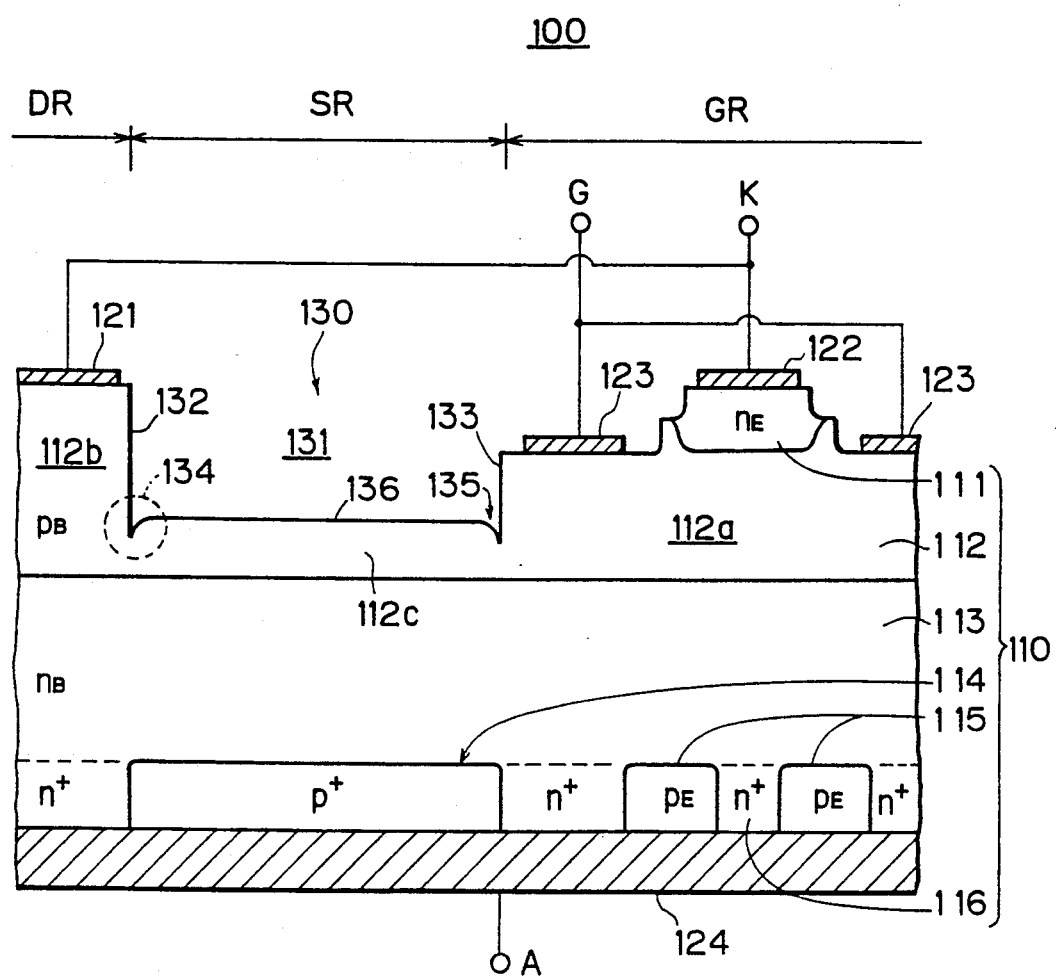
FIG. 9 is a partial cross-sectional view of a conventional reverse-conducting GTO.
Figure 10:
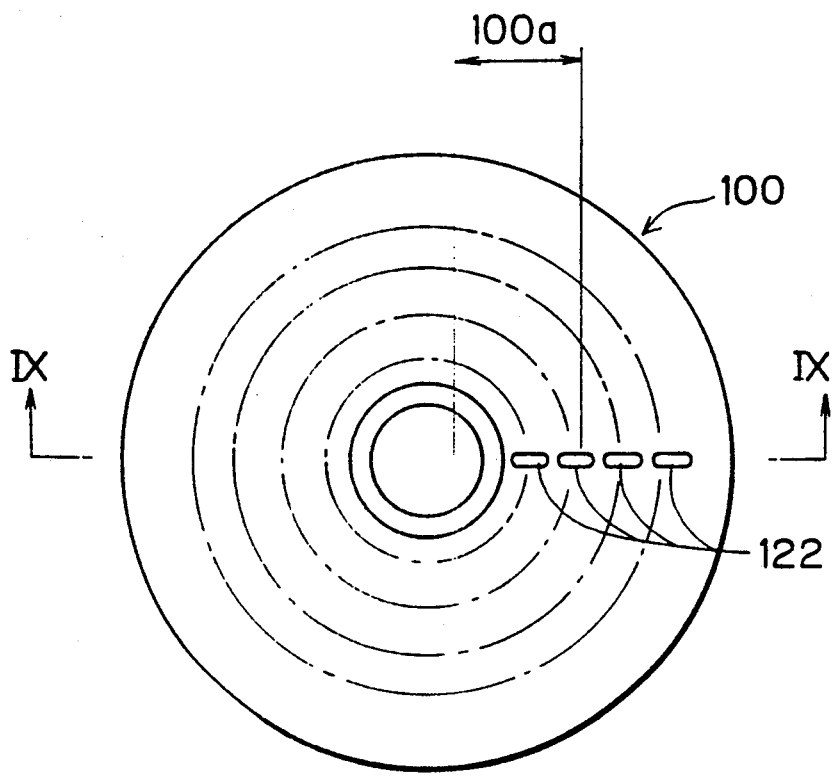
FIG. 10 is a plan view of the conventional reverse-conducting GTO.
Figure 13:
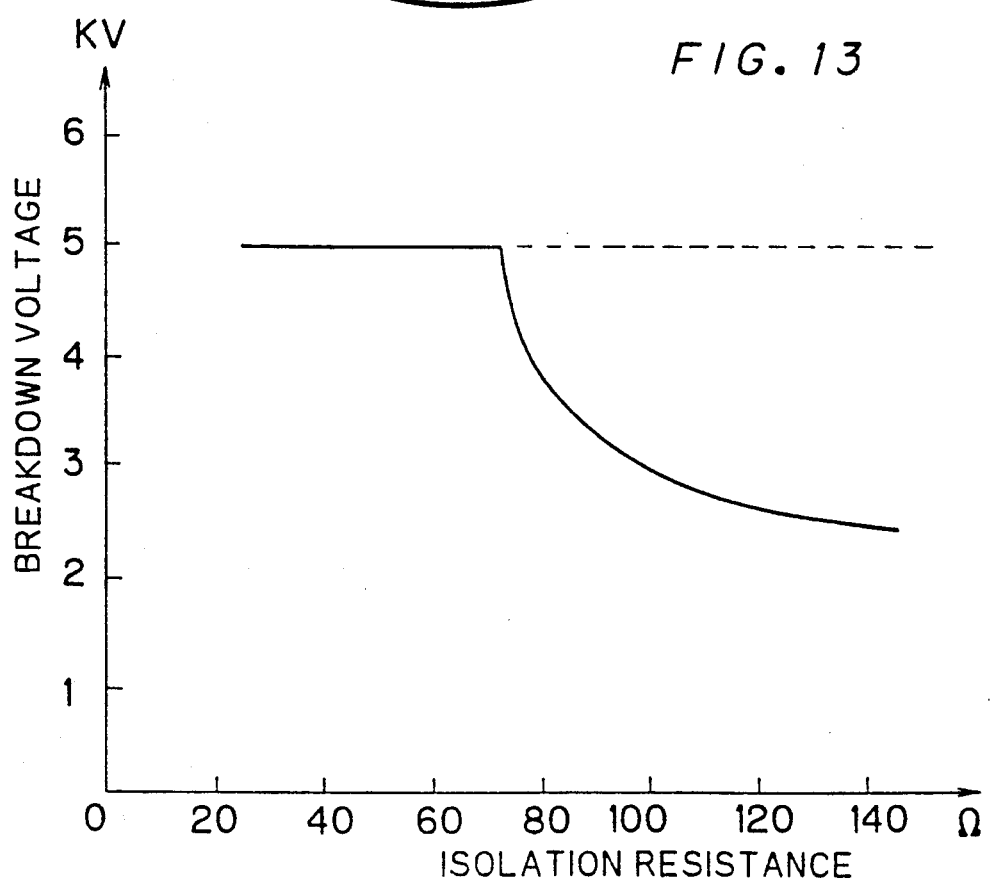
FIG. 13 is a graph illustrating a relation between isolation resistance and forward breakdown voltage in the conventional reverse-conducting GTO.

FIG. 7 shows a multistage groove 81 according to another preferred embodiment of he present invention. At both ends of the multistage groove 81 are provided step structures 82 and 83, each of which has a two-stage step structure. This type of two-stage step structure can be obtained through three etchings in which the etching width is in series expanded. The width $W_2$ of the step structures 82 and 83 is also preferably 10% or more of the overall width W of the isolating groove 81. A relation between separate widths $W_{21}$ and $W_{22}$ of the respective steps is arbitrary, whether the widths $W_{21}$ and $W_{22}$ are equal to each other as shown in FIG. 8A or different from each other as shown in FIG. 8B. A step structure having three steps or more is also useful.

The present invention can be applied to every type of semiconductor device which requires the resistive isolation between the elements. An example is a device including a reverse parallel connection between the thyristor and the diode other than the GTO, e.g., a reverse-conducting GATT (a reverse-conducting gate associated turn-off thyristor) and a photo thyristor having a main thyristor and an auxiliary thyristor.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A semiconductor device comprising:
   (a) a first semiconductor element structure formed in a first region of a semiconductor body including a first conductivity type layer and a second conductivity type layer;
   (b) a second semiconductor element structure formed at a distance from said first semiconductor element structure in a direction parallel to a major surface of said semiconductor body, the second semiconductor element also including the first conducting type layer and the second conductivity type layer; and
   (c) an element isolation structure provided between said first and second semiconductor element structures, said element isolation structure including the first conductivity type layer and the second conductivity type layer;
   wherein said element isolation structure is provided with a multistage groove formed on said major surface having a depth increasing stepwise in series toward the center thereof, said multistage groove is formed only within the first conductivity type layer, and a deepest portion of said multistage groove has a substantially flat surface, said multistage groove having plural stages formed in said groove on both opposed sides of said substantially flat surface.

2. A semiconductor device as set forth in claim 1, wherein:
   said multistage groove has a step structure on an inner wall portion of said multistage groove; and
   the width of said step structure is 10% or more of the overall width of said multistage groove.

3. A semiconductor device as set forth in claim 2, wherein said deepest portion has edge portions deeper than a substantially flat central portion of said deepest portion.

4. A semiconductor device as set forth in claim 3, wherein
   said step structure has a step surface defined between a step edge and a step corner; and said step corner is located at a position lower than said step edge.

5. A semiconductor device as set forth in claim 4, wherein said position of step corner is higher than a position at which said edge portion of said bottom floor is located.

6. A semiconductor device as set forth in claim 5, wherein a first distance in height between said position of step corner and said position of said edge portion is larger than a second distance in height between said central portion of said bottom floor and said edge portion of said bottom floor.

7. A semiconductor device as set forth in claim 6, wherein said position of step corner is higher than said position of said central portion of said bottom floor.

8. A semiconductor device as set forth in claim 7, wherein said second difference is in the range from 1.0 $\mu$m to 1.5 $\mu$m.

9. A semiconductor device as set forth in claim 7, wherein said semiconductor body is provided therein with a pn junction structure having a pn junction interface extending in parallel to said major surface of said semiconductor body, said pn junction structure joining the first conductivity type layer and the second conductivity type layer;

said pn junction structure has first through third portions aligned in parallel to said major surface of said semiconductor body;

said first and third portions of said pn junction structure are located in said first and second regions of said semiconductor body and are members of said first and second semiconductor element structure, respectively; and said second portion of said pn junction structure is located between said first and second regions of said semiconductor body, and exposed to said multistage groove.

* * * * *